(12) United States Patent
Phan

(10) Patent No.: US 6,634,003 B1
(45) Date of Patent: Oct. 14, 2003

(54) DECODING CIRCUIT FOR MEMORIES WITH REDUNDANCY

(75) Inventor: Tuan Phan, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/501,807

(22) Filed: Feb. 10, 2000

(51) Int. Cl.[7] .......................... G11C 29/00; G11C 27/00; G11C 7/00; G01R 31/28; H01H 31/02
(52) U.S. Cl. ...................... 714/710; 714/798; 714/733; 324/537; 365/45; 365/200; 365/222
(58) Field of Search ................................. 714/710, 718, 714/733; 324/537; 365/200, 201, 222, 45

(56) References Cited

U.S. PATENT DOCUMENTS

| | | | | |
|---|---|---|---|---|
| 5,724,295 A | * | 3/1998 | Beiley et al. ............... | 365/222 |
| 5,860,092 A | | 1/1999 | Breid et al. ................. | 711/118 |
| 5,920,515 A | * | 7/1999 | Shaik et al. ................ | 365/200 |
| 6,041,422 A | * | 3/2000 | Deas ............................. | 714/8 |
| 6,067,262 A | * | 5/2000 | Irrinki et al. ............... | 365/201 |
| 6,097,647 A | * | 8/2000 | Zagar et al. ................ | 365/201 |
| 6,202,180 B1 | * | 3/2001 | Nose ........................... | 714/718 |
| 6,300,769 B1 | * | 10/2001 | Phan ........................... | 324/537 |
| 6,304,989 B1 | * | 10/2001 | Kraus et al. ............... | 714/733 |
| 6,367,042 B1 | * | 4/2002 | Phan et al. .................. | 714/733 |
| 6,425,103 B1 | * | 7/2002 | Phan ........................... | 714/733 |
| 6,445,602 B1 | * | 9/2002 | Kokudo et al. .............. | 365/45 |
| 6,505,313 B1 | * | 1/2003 | Phan et al. .................. | 714/718 |

* cited by examiner

Primary Examiner—Phung M. Chung
Assistant Examiner—Anthony T. Whittington
(74) Attorney, Agent, or Firm—Westman, Champlin & Kelly

(57) ABSTRACT

A system for disabling defective memory elements includes a memory array, an address decoder and a decoder element. The memory array has multiple memory elements for storing data. The address decoder receives a requested memory address and produces multiple element-select signals. Each element-select signal is associated with one of the memory elements and indicates whether access to the associated memory element is requested by the host. The decoder element receives one of the element-select signals and provides an output signal to the associated memory element. If the associated memory element is functional, the output signal enables or disables the associated memory element in accordance with the associated element-select signal. If, on the other hand, the associated memory element is defective, the output signal disables the associated memory element regardless of the associated element-select signal. The decoder element is programmed upon power-up so as not to require an address comparison for each memory access cycle.

16 Claims, 5 Drawing Sheets

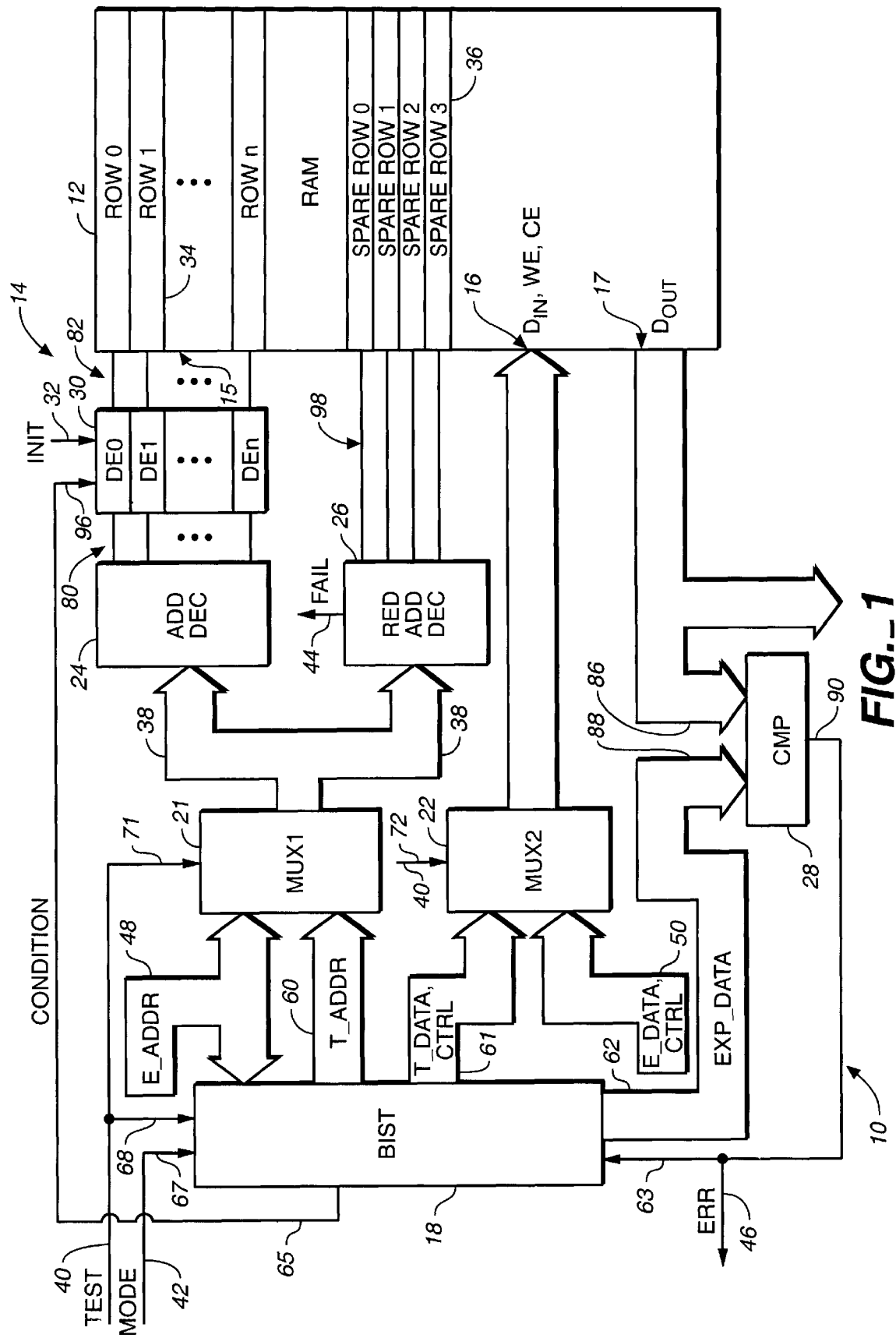
FIG._1

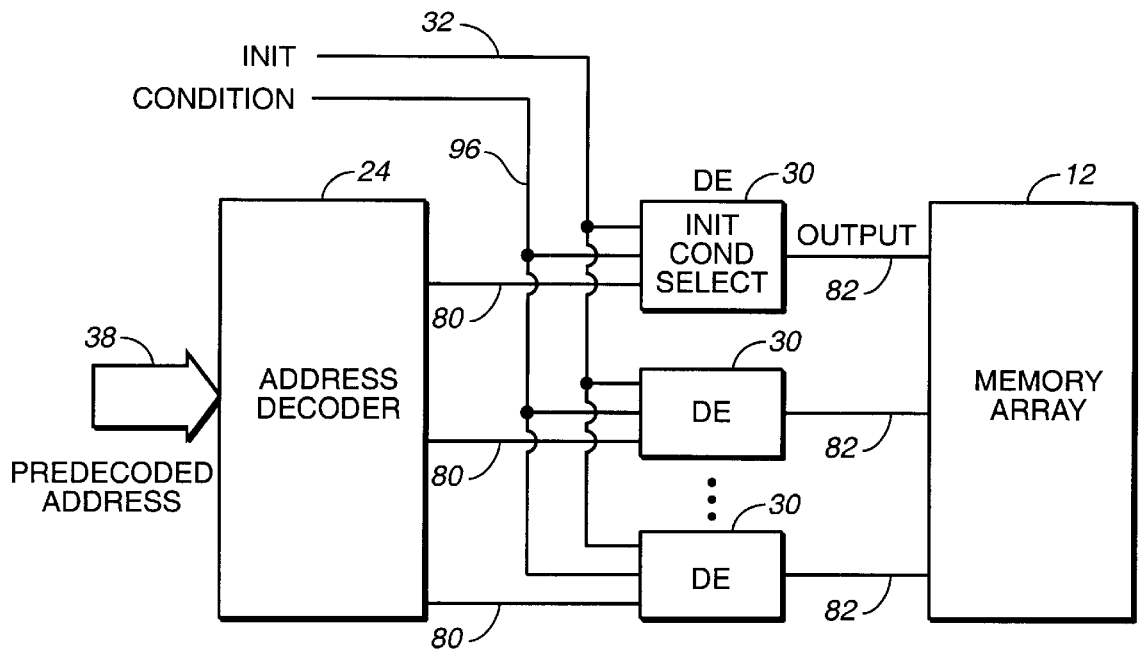
FIG._2
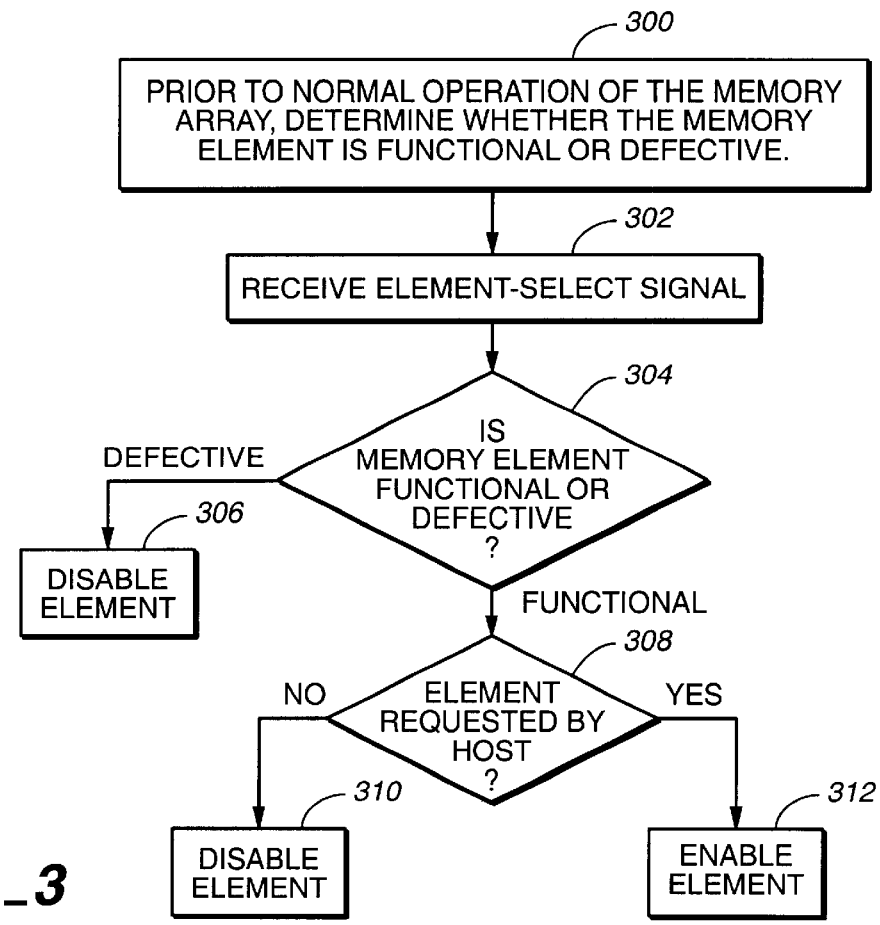
FIG._3

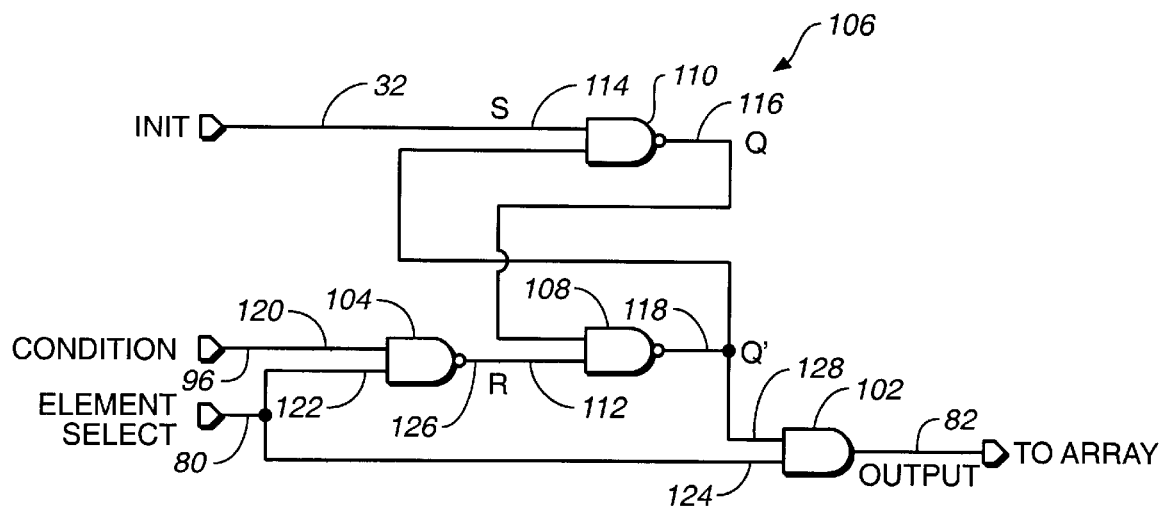
FIG._4
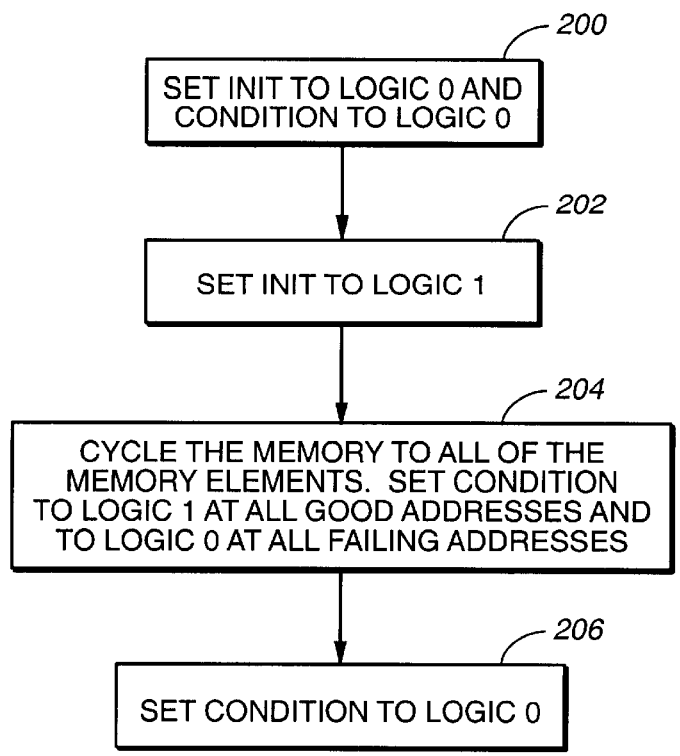
FIG._5

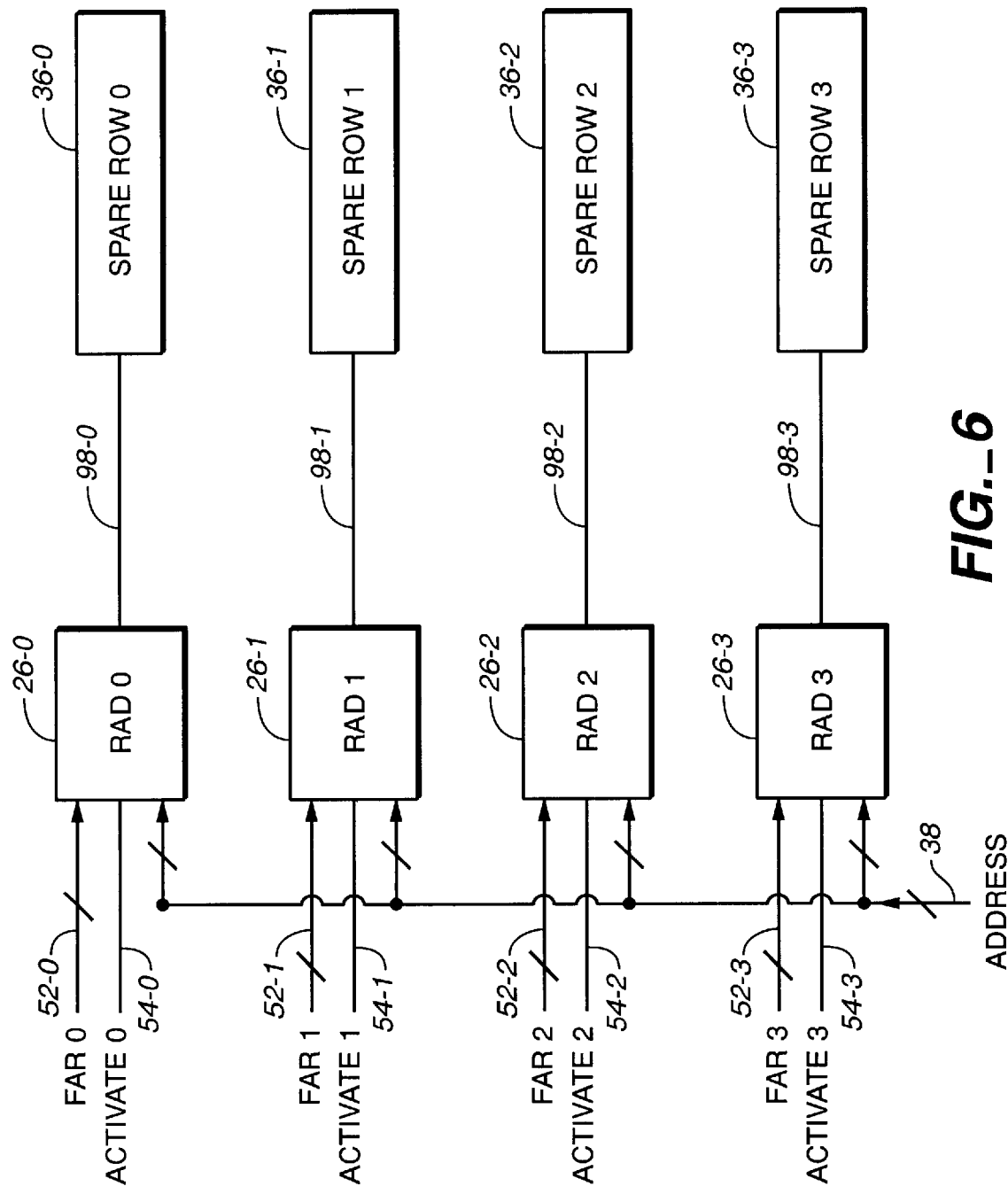
FIG._6

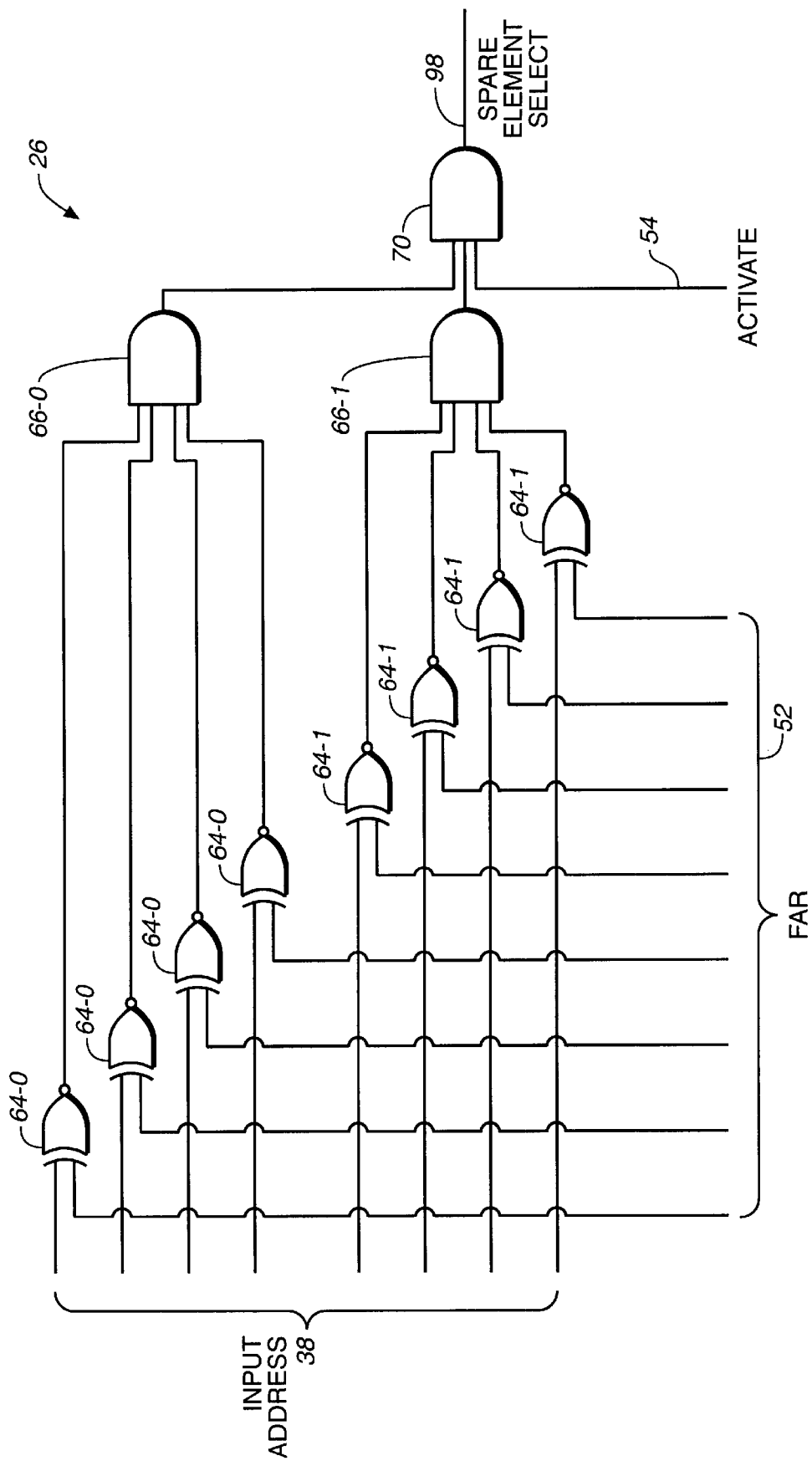
FIG._7

DECODING CIRCUIT FOR MEMORIES WITH REDUNDANCY

CROSS-REFERENCE TO RELATED APPLICATION

The following U.S. patent applications, assigned to the same assignee as the present invention, are related to the present application:

U.S. patent application Ser. No. 09/426,034, entitled "BUILT-IN SELF REPAIR CIRCUIT WITH PAUSE. FOR DATA RETENTION COVERAGE," filed on Oct. 25. 1999.

BACKGROUND OF THE INVENTION

The present invention relates generally to integrated circuit memory devices. More particularly, the present invention relates to decoding circuits for memories with redundancy.

Semiconductor integrated circuit memories such as static random access memories ("SRAMs") have used BISR circuits to screen for and sometimes repair certain memory failures in she factory and in the field. BISR circuits typically include a state machine, which is fabricated on the integrated circuit with the memory array for implementing a selected test algorithm. This algorithm is initiated in the factory by an external memory tester. In the field, the algorithm is initiated on start-up.

The prevailing method for detecting faults in SRAMs that have BISR circuits is to screen for these faults in the factory. In the factory, the memory and associated BISR circuit are coupled to a memory tester, which provides a supply voltage and a system clock to the memory array and provides control signals to operate the BISR circuit. Typically, memory testers use a two-pass approach through the BISR circuit test algorithm. In the first pass, memory failures are detected and repaired. In the second pass, the repairs are verified.

A common BISR test algorithm consists of several runs through the memory array. The BISR test algorithm performs a sequence of writes and reads on each cell in the memory array, comparing the output of each read with expected data. When a discrepancy is detected, the BISR test algorithm re-maps the memory addresses to replace the row containing the failing cell with a redundant row. These repairs are verified in the second pass through the BISR test algorithm.

When the memory is installed in the field, the BISR test algorithm is initiated on start-up. Then, during normal operation of the memory array, typical existing systems employ an address matching circuit connected to the input addresses. Incoming addresses are compared against pre-programmed failing addresses on every access cycle. If the incoming address matches a failing address, a redundant memory element is utilized in place of the target memory element. The comparison has a significant timing impact on the system. The more address hits there are, the longer it takes to perform the comparison. Currently, a 10-bit address can take 2 ns (nanoseconds) or more to be matched.

The present invention provides a solution to this and other problems and offers other advantages over the prior art.

SUMMARY OF THE INVENTION

The present invention relates to decoding circuits for memories with redundancy.

One embodiment of the present invention is directed to a system for disabling defective memory elements. The system includes a memory array, an address decoder and a decoder element. The memory array has multiple memory elements for storing data. The address decoder receives a requested memory address and produces multiple element-select signals. Each element-select signal is associated with one of the memory elements and indicates whether access to the associated memory element is requested by the host. The decoder element receives one of the element-select signals and provides an output signal to the associated memory element. If the associated memory element is functional, the output signal enables or disables the associated memory element in accordance with the associated element-select signal. Whereas if the associated memory element is defective, the output signal disables the associated memory element regardless of the associated element-select signal.

One embodiment of the present invention further includes a spare memory element and a redundant-address decoder. The spare memory element is able to store data that is intended for a predetermined defective memory element. The redundant-address decoder receives the requested memory address and provides a spare-element-select signal to the spare memory element. The spare-element-select signal enables the spare memory element if the requested memory address matches the address of the defective memory element.

Another embodiment of the present invention is directed to a method of disabling defective memory elements of a memory array Prior to normal operation of the memory array, it is determined whether a particular memory element is functional or defective. An element-select signal indicating whether access to the memory element is requested by a host is received. If the memory element is functional, the memory element is enabled or disabled in accordance with the element-select signal. On the other hand, if the memory element is defective, the memory element is disabled regardless of the element-elect signal.

In a further embodiment of the above method, if the memory element is defective, a spare memory element is provided and the address of the defective memory element is stored. The address of a memory element that the host requests access to is received. The address of the defective memory element is compared to the requested address. If the address of the defective memory element matches the requested address, the spare memory element is enabled.

These and various other features as well as advantages which characterize the present invention will be apparent upon reading of the following detailed description and review of the associated drawings.

BRIEF DESCRIPTION OF THE DRAWINGS

FIG. 1 is a block diagram of an integrated circuit memory having a built-in self repair BISR) circuit according to an illustrative embodiment of the present invention.

FIG. 2 is a block diagram depicting a circuit for disabling faulty memory elements in accordance with the present invention.

FIG. 3 is a flowchart representing a method of disabling defective memory elements in a memory array according to an illustrative embodiment of the present invention.

FIG. 4 is a logic circuit of an illustrative embodiment of a decoder element according to the present invention.

FIG. 5 is a flowchart representing a method of disabling defective memory elements in a memory array according to an illustrative embodiment of the present invention.

FIG. 6 is a block diagram of a redundant address decode circuit according to an illustrative embodiment of the present invention.

FIG. 7 is a logic diagram of an illustrative implementation of a single redundant-address decoder in accordance with the present invention.

DETAILED DESCRIPTION OF ILLUSTRATIVE EMBODIMENTS

FIG. 1 is a block diagram of an integrated circuit 10 having a memory array 12 and built-in self repair (BISR) circuit 14, according to an illustrative embodiment of the present invention. BISR circuit 14 is fabricated with memory array 12 on integrated circuit 10. Memory array 12 can include a static random access memory (SRAM), for example. Other types of memories can also be used. Memory array 12 includes word-line input 15, data and control input 16 and data output 17.

BISR circuit 14 includes built-in self test (BIST) circuit 18, multiplexers 21 and 22, address decode circuit 24, redundant-address decode circuit 26, compare circuit 28 and decoder elements 30. BISR circuit 14 further includes initialize input 32, test enable input 40, field/factory mode input 42, fail flag output 44, error output 46, external address input 48, and external data and control input 50. BIST circuit 18 includes test address output 60, test data and control output 61, expected data output 62, error input 63, condition output 65, mode input 67 and test enable input 68.

External address input 48 and external data and control input 50 provide the address, data and control to memory array 12 during normal operation. These inputs are driven by input pins or other circuitry (not shown) on integrated circuit 10. External address input 48 and external data and control input 50 are coupled to a first of two data inputs of multiplexers 21 and 22, respectively. The second data inputs of multiplexers 21 and 22 are coupled to test address output 60 and test data and control output 61, respectively, of BIST circuit 18. Multiplexers 21 and 22 control whether memory array 12 is operated by external circuitry or by BIST circuit 18 based on a test enables signal received on input 40, which is coupled to multiplexer select inputs 71 and 72.

The address output 38 of multiplexer 21 is coupled to the inputs of both the address decoder 24 and the redundant-address decode circuit 26. Address decode circuit 24 provides a plurality of word lines 80. According to an illustrative embodiment of the present invention, each word line 80 is coupled to a decoder element 30, whose output 82, in turn, is provided to word-line input 15 of memory array 12 for driving selected memory elements (in the illustrative embodiment of FIG. 1, rows 34). For clarity's sake, the present invention is described in FIG. 1, and in other segments of the present application, with respect to driving memory rows 34. However, the present invention also applies to driving other memory elements, such as memory columns or individual memory cells. Each decoder element 30 also receives condition signal 65 at condition input 96. The condition signal 65 is indicative of whether the associated memory element 34 is functional or defective. The outputs 82 of the decoder elements 30 are based in part on the values of word line 80 and condition input 96, as is described in detail below. Decoder elements 30 also include initialize input 32 which serves to initialize the settings of decoder elements 30.

Redundant-address decode circuit 26 drives spare memory elements 36 through redundant word lines 98 when the requested memory element 34 is defective. If redundant-address decode circuit 26 runs out of redundant memory locations (e.g. rows 34), circuit 26 activates fail flag 44.

The data output of multiplexer 22 is coupled to data and control input 16 of memory 12 in one embodiment, data and control input 16 includes data input $D_{IN}$, write enable input WE and chip enable input CE.

Data output 17 of memory array 12 is coupled to output pins or other circuitry (not shown) on integrated circuit 10 and is also coupled to input 86 of comparator circuit 28. Input 88 of comparator circuit 28 is coupled to expected data output 62 of BIST circuit 18. Output 90 of comparator circuit 28 is coupled to error input 63 of BIST circuit 18 and to error output 46. Condition output 65 of BIST circuit 18 is coupled to condition input 96 of decoder element 30.

During normal operation, test enable input 40 is inactive, which disables BIST circuit 18 and controls multiplexers 21 and 22 to couple external address input 48 and external data and control input 50 to memory array 12 for accessing selected memory locations. Multiplexer 21 provides the selected address to address decoder 24 and to redundant-address decode circuit 26. If the requested memory element is functional, as determined in test mode prior to normal operation, decoder elements 30 drive the selected memory element 34. If, on the other hand, the requested memory element is faulty, redundant-address decode circuit 26 selectively drives a spare memory element 36 with redundant word lines 98 to avoid faulty memory cells in memory array 12.

In test mode, test enable input 40 is active, which activates BIST circuit 18 and multiplexers 21 and 22 select test address output 60 and test data and control output 61 for driving memory array 12. BIST circuit 18 includes a state machine, for example, which implements a built-in self test algorithm for testing each cell of memory array 12. BIST circuit 18 can include a state machine or finite controlled system similar to the commercially available RAM BISTs provided by LSI Logic Corporation of Milpitas, Calif. or LogicVision, Inc. of San Jose, Calif., for example. Other circuits either hard wired or driven by software can be used to implement the test algorithm.

BIST circuit 18 controls outputs 60 and 61 to perform a sequence of writes and reads on memory array 12. The test algorithm sequences through each address location of memory array 12 and performs several write and read operations at each location. For example, the test algorithm can initially write a test pattern to memory array 12 such that each memory cell has a definite state. The test algorithm then reads the stored data (i.e. logic state) from each memory cell, writes the opposite state to the memory cell and then reads the stored, opposite state from the memory cell. As each cell or address location is read, compare circuit 28 compares the data that was read with expected data provided by BIST circuit 18 on output 62. The test algorithm then moves on to the next cell or address location in the array. The test algorithm can run through the addressed locations in memory array 12 multiple times and in various orders, with multiple test patterns being written to and read from the array. This type of test algorithm is commonly referred to as a March-type test algorithm.

If the data read from a particular cell or address of memory array 12 does not match the expected data, compare circuit 28 activates error output 90 to signal that the memory cell or location being tested is faulty. When BIST circuit 18 detects that error output 90 is active, the address of the defective element is stored in a failing address register FAR (not shown). The failing address register may reside within the BIST circuit 18 itself or may be external to BIST circuit 18.

FIG. 2 is a block diagram depicting a circuit for disabling faulty memory elements in accordance with one embodiment of the present invention. The circuit includes address decoder 24, decoder elements 30 and memory array 12, which are also shown in FIG. 1. The memory array 12 has multiple memory elements 34 for storing data, as shown in FIG. 1. The address decoder 24 receives a requested memory address 38 from multiplexer 21 and produces multiple element-select signals, or word lines. 80. Each element-select signal 80 is associated with one of the memory elements 34 and indicates whether access to the associated memory element 34 is requested by the host. Each decoder element 30 receives one of the element-select signals 80 and provides an output signal 82 to the associated memory element 34. The output signal 82 selectively enables and disables its associated memory element 34. If the associated memory element 34 is functional the output signal 82 enables or disables the associated memory element 34 in accordance with the corresponding element-select signal 80. That is, if the element-select signal 80 indicates that the associated memory element is requested by the host, output 82 enables the memory element 34, but if the element-select signal 80 indicates that the associated memory element is not requested by the host, output 82 disables the memory element 34. If, on the other hand, the associated memory element 34 is defective, the output signal 82 disables the associated memory element 34 irrespective of the value of the associated element-select signal 80. This prevents defective memory elements from being accessed and thus prevents data from being contaminated or lost.

According to an illustrative embodiment of the present invention, decoder elements 30 are separately programmable upon power-up. Testing of the memory array 12 is performed prior to the programming of the decoder elements 30. This testing can be performed in the factory or at various points in time in the field, or both. The testing of the memory array 12 determines which memory elements 34 are functional and which, if any, are defective. According to the present invention, at power-up of the memory array 12, the memory elements 34 are cycled through. During this process, condition signal 96 indicates whether the presently requested memory element 34 is functional or defective. Condition signal 96 determines how each decoder element 30 will be programmed for normal operation of the memory array 12. If condition signal 96 indicates that the associated memory element 34 is functional, decoder element 30 is programmed such that the associated memory element 34 will be enabled or disabled in accordance with the corresponding element-select signal 80. If condition signal 96 indicates that the associated memory element 34 is defective, decoder element 3C is programmed such that the associated memory element 34 is always disabled, regardless of the value of the associated element-select signal 80. In an illustrative embodiment, condition signal 96 is provided by BIST circuit 18, as shown in FIG. 1. But condition signal 96 may also be provided by a device external to BIST circuit 18. Initialize signal 32 is also used to program the decoder elements 30 upon power-up, as is described below.

A method of disabling defective memory elements 34 in a memory array 12 using a circuit such as that of FIG. 2 is represented in the flow chart of FIG. 3. At block 300, prior to normal operation of the memory array 12, it is determined whether a particular memory element 34 is functional or defective. At block 302, an element-select signal 80 indicating whether access to the memory element 34 is requested by a host is received. At block 304 it is queried whether the memory element 34 is functional or defective. If the memory element 34 is defective, the memory element 34 is disabled regardless of the element-elect signal 80, as indicated at block 306. If, on the other hand the memory element 34 is functional, it is queried whether the memory element 34 is requested by the host, as shown at block 308. If the memory element 34 is requested by the host, the element 34 is enabled, as shown at block 312. If the memory element is not requested, the element 34 is disabled, as shown at block 310.

FIG. 4 is a logic circuit of an illustrative embodiment of a decoder element 30 according to the present invention. In this embodiment, decoder element includes AND gate 102, NAND gate 104 and latch 106. Latch 106 includes NAND gates 108 and 110 configured as a direct-coupled NAND-gate RS flip-flop having an R input 112, an S input 114, a Q output 116 and a Q' output 116. Initialize signal 32 is coupled to S input 114 of flip-flop 106. Condition signal 96 is coupled to input 120 of NAND gate 104. Element-select signal 80 is coupled to input 122 of NAND gate 104, as well as to input 124 of AND gate 102. Output 126 of NAND gate 104 is coupled to R input 112 of flip-flop. 106. The output Q' 118 of flip-flop 106 is coupled to input 128 of AND gate 102. Output 82 of AND gate 102 is provided to an associated memory element 34 in memory array 12. In practice, AND gate can be implemented as a NAND gate with an inverter coupled to its output. A functional description of decoder element 30 is shown in Table 1.

TABLE 1

| | | Functional Description |
|---|---|---|
| INIT | CONDITION | OUTPUT |
| 0 | 0 | 0 |
| 0 | 1 | Unused, output unknown |
| 1 | 0 | Quiescent, outputs remains the same as previous state |
| 1 | 1 | Output follows decoder signal |

In operation, upon power-up, after testing memory elements 34 and prior to normal operation of memory array 12, a sequence of steps is performed to program decoder element 30. This sequence is summarized in the flowchart of FIG. 5. In this illustrative embodiment, element-select signal is a logical "1" when the associated memory element is requested. Also, a memory element 34 is enabled when output 82 of its associated decoder element 30 is a logical "1" and disabled when output 82 is a logical "0." The first step 200 in programming decoder element 30 is to set initialize signal 32 and condition signal 96 to logic "0." After this step, Q' 128 is at logic "0," preventing all element select signals 80 from getting through. The second step 202 in programming decoder element 30 is to set initialize signal 32 to logic "1." Q' remains at logic "0" after this step. The third step 204 is to cycle through all of the memory elements 34 in memory array 12. When a particular memory element 34 is accessed (cycled to) in this process, element select signal 80 becomes a logical "1." At the same time, if that particular memory element 34 is functional, as determined during the memory array testing performed prior to programming the decoder elements 30, condition signal 96 is set to a logical "1." Conversely, if he memory element is defective, condition signal 96 is set to a logical "0." Thus, if, and only if, the memory element is functional, output 126 of NAND gate 104 is a logical "0." In turn, when R input 112 of flip-flop 106 is "0," output Q' 118 of flip-flop 106 is a logical "1." If condition signal 96 is a logical "0," signifying that memory element 34 is defective, Q' will hold a logical "0."

After all of the memory elements 34 have been cycled through; the fourth step 206 calls for holding initialize signal 32 at logic "1" and setting and holding condition signal 96 at logic "0" at all times. This causes the value held by output Q' 118 after step three 204 to be held throughout normal operation of the memory 12. After this sequence of steps, the memory array is ready for normal operation. If a given memory element. 34 is functional, the value of Q' of its associated decoder element 30 will be a logical "1." Then, because Q' is "anded" with the element select signal 80, the value of element signal 80 will simply pass through decoder element 30 to memory element 34 unchanged. However, if a given memory element 34 is defective, the value of Q' of its associated decoder element 30 will be a logical "0." Then, because Q' is "AND-ed" with the element select signal 80, the value of output 82 will be a logical "0" regardless of the state of element-select signal 80. In this way, decoder element 30 prevents a defective memory element 34 from being enabled during normal operation.

FIG. 6 is a block diagram of redundant address decode (RAD) circuit 26 according to an illustrative embodiment of the present invention. FIG. 6 shows redundant-address decoders 26-0, 26-1, 26-2 and 26-3 coupled to spare memory rows 36-0, 36-1, 36-2 and 36-3 via spare-element-select lines 98-0, 98-1, 98-2 and 98-3. Each redundant-address decoder 26-0, 26-1, 26-2, 26-3 is used to activate one spare row 36-0, 36-1, 36-2, 36-3. Though FIG. 6 shows four spare rows 36, any number may he employed in accordance with the present invention. Of course the present invention can also be employed to repair memory elements other than memory rows 34, such as memory columns or individual memory cells. Each redundant-address decoder is coupled to a failing address register (FAR) 52-0, 52-1, 52-2, 52-3 which holds the address of a particular defective memory element 34 as determined beforehand by memory testing. The failing address 52 register can be located in BIST circuit 18 or can be located elsewhere in BISR circuit 14. Alternatively, the address of the defective memory element can be stored by a fuse bank or other device in BISR circuit 14. Each redundant-address decoder 26 also receives the address 38 of the memory element 34 presently requested by the host. Each spare memory element 36 is adapted to store data that is intended for a predetermined defective memory element 34. The spare-element-select signal 98 enables the spare memory element 36 if the requested memory address 38 matches the address stored in the failing address register 52. In an illustrative embodiment, each redundant-address decoder 26 also receives an activate signal 54-0, 54-1, 54-2, 54-3 which allows the redundant address decoder 36 to be selectively activated or deactivated.

FIG. 7 is a logic diagram of an illustrative implementation of a single redundant-address decoder 36 in accordance with the present invention. The diagram of FIG. 7 is for a memory array 12 having 8-bit addresses. Of course the circuit can be expanded to accommodate memories 12 having addresses of any size. According to this implementation, redundant-address decoder 26 includes equivalence, or exclusive-nor, gates 64, AND gates 66 and AND gate 70. Each equivalence gate 64 receives one bit of the address 52 of the defective element that the associated spare element 36 "replaces." Each equivalence gate 64 also receives a corresponding bit of the requested memory address 38. The outputs of each of equivalence gates 64-0 are provided to AND gate 66-0. The outputs of each of equivalence gates 64-1 are provided to AND gate 66-1. The outputs of AND gates 66-0 and 66-1 are provided to AND gate 70. In an illustrative embodiment, AND gate 70 also receives activate signal 54. Thus, spare-element-select signal 98 will be a logical "1," thus enabling the spare memory element 36, only when the requested address 38 is identical to the address held in the failing address register 52 and the redundant-address decoder 26 is activated (logic "1"). Alternative designs can also be implemented to achieve this function. For example, AND gates 66 can be replaced with NAND gates, AND gate 70 can be replaced with a NOR gate and an inverter, and an inverter can be placed in the path of the activate signal 54.

The present invention "repairs" defective memory elements without comparing incoming addresses against previously determined failing addresses on every access cycle, as is done in the prior art. Therefore, the present invention significantly reduces the per-access timing penalty arising from the repair of defective elements. Using the present invention, the only per-access timing penalty associated with repairing defective elements is the delay arising from AND gate 102 (see FIG. 4). With current technology, this delay is 0.5 ns or less. In contrast, the address-matching circuits of the prior art take about 2 ns each access cycle to compare a requested 10-bit address to the failing addresses. The delay is even greater with larger addresses.

In summary, one embodiment of the present invention is directed to a system for disabling defective memory elements 34. The system includes a memory array 12, an address decoder 24 and a decoder element 30. The memory array 12 has multiple memory elements 34 for storing data. The address decoder 24 receives a requested memory address and produces multiple element-select signals 80. Each element-select signal 80 is associated with one of the memory elements 34 and indicates whether access to the associated memory element 34 is requested by the host. The decoder element 30 receives one of the element-select signals 80 and provides an output signal 82 to the associated memory element 34. If the associated memory element 34 is functional, the output signal 82 enables or disables the associated memory element 34 in accordance with the associated element-select signal 80. But if the associated memory element 34 is defective, the output signal 82 disables the associated memory element 34 regardless of the associated element-select signal 80.

One embodiment of the present invention further includes a spare memory element 36 and a redundant-address decoder 26. The spare memory element 36 is able to store data that is intended for a predetermined defective memory element 34. The redundant-address decoder 26 receives the requested memory address 38 and provides a spare-element-select signal 98 to the spare memory element 36. The spare-element-select signal 98 enables the spare memory element 36 if the requested memory address 38 matches the address 52 of the defective memory element 34.

Another embodiment of the present invention is directed to a method of disabling defective memory elements 34 of a memory array 12. Prior to normal operation of the memory array 12, it is determined whether a particular memory element 34 is functional or defective. An element-select signal 80 indicating whether access to the memory element 34 is requested by host is received. If the memory element 34 is functional, the memory element 34 is enabled or disabled in accordance with the element-select signal 80. On the other hand, if the memory element 34 is defective, the memory element 34 is disabled regardless of the element-elect signal 80.

In a further embodiment of the above method, if the memory element 34 is defective, a spare memory element 36 is provided and the address 52 of the defective-memory element 34 is stored. The address 38 of a memory element 34 that the host requests access to is received. The address 52 of the defective memory element 34 is compared to the requested address 38. If the address 52 of the defective memory element 34 matches the requested address 38, the spare memory element 36 is enabled.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of structure and arrangement of parts within the principles of the present invention to the full extent indicated by the broad general meaning of the terms in which the appended claims are expressed. For example, although the present invention was described primarily with respect to repairing defective memory rows, it applies equally to repairing other memory elements, such as memory columns, without departing from the scope and spirit of the present invention. Other modifications can also be made.

What is claimed is:

1. A system for disabling defective memory elements, comprising:
    a memory array having a plurality of memory elements adapted to store data;
    an address decoder adapted to receive a requested memory address and to produce a plurality of element-select signals, each element-select signal being associated with one of the memory elements and indicating whether access to the associated memory element is requested by a host; and
    a decoder element adapted to receive one of the element-select signals and to provide an output signal to the associated memory element, wherein if the associated memory element is functional, the output signal enables or disables the associated memory element in accordance with the associated element select signal, whereas if the associated memory element is defective, the output signal disables the associated memory element regardless of the associated element-select signal.

2. The system of claim 1 wherein the system is programmable upon power-up such that an address comparison does not need to be performed for each memory access.

3. The system of claim 1 further comprising:
    a built-in self-repair circuit adapted to determine whether a particular memory element is functional or defective and provide a condition signal to each decoder element indicating whether the associated memory element is functional or defective.

4. The system of claim 3 wherein the element-select signal produced by the address decoder is a digital "1" if access to the associated memory element is requested by the host and a digital "0" if access to the associated memory element is not requested, wherein the associated memory element is enabled if the output signal from the decoder element is a digital "1" and disabled if the output signal from the decoder element is a digital "0" and wherein the decoder element comprises an AND gate having first and second inputs and an output, the first input being coupled to the associated element-select signal, the second input being coupled to an output of a latch, the latch output holding a digital value of "0" if the associated memory element is defective and holding a digital value of "1" if the associated memory element is functional, and the output of the AND gate being coupled to the associated memory element.

5. The system of claim 4 wherein the condition signal produced by the built-in self-repair circuit is a digital "1" if the associated memory element is functional and a digital "0" if the associated memory element is defective, and wherein the latch comprises a direct-coupled NAND-gate RS flip-flop having two inputs, S and R, and an output Q', wherein the R input is coupled to the output of a NAND gate having first and second inputs, the first input of the NAND gate being coupled to the condition signal and the second input of the NAND gate being coupled to the associated element-select signal, and wherein the Q' output is coupled to the second input of the AND gate.

6. The system of claim 1 further comprising:
    a spare memory element adapted to store data that is intended for a predetermined defective memory element; and
    a redundant-address decoder adapted to receive the requested memory address and to provide a spare-element-select signal to the spare memory element, the spare-element-select signal enabling the spare memory element if the requested memory address matches an address of the defective memory element.

7. The system of claim 6 wherein the redundant-address decoder comprises a comparator adapted to compare the address of the defective element to the requested memory address.

8. The system of claim 7 wherein the comparator comprises a plurality of equivalence gates, each adapted to receive one bit of the address of the defective element and a corresponding bit of the requested memory address, and wherein the spare-element-select signal enables the spare memory element when the output of all the equivalence gates is a digital "1."

9. A method of disabling defective memory elements of a memory array, comprising:
    determining prior to normal operation of the memory array whether a particular memory element is functional or defective;
    decoding a requested address with an address decoder;
    receiving an element-select signal from the address decoder indicating whether access to the memory element is requested by a host;
    if the memory element is functional, enabling or disabling the memory element in accordance with the element-select signal; and
    if the memory element is defective, disabling the memory element regardless of the element-select signal.

10. The method of claim 9 wherein the element-select signal is a digital "1" if access to the memory element is requested by the host and a digital "0" if access to the memory element is not requested, and wherein enabling/disabling the memory element comprises:
    providing an AND gate having first and second inputs and an output;
    providing a latch having an output that holds a digital value of "0" if the associated memory element is defective and that holds a digital value of "1" if the associated memory element is functional;
    coupling the first input to the element-select signal;
    coupling the second input to the output of the latch; and
    coupling the output of the AND gate to the memory element, wherein the memory element is enabled if the output signal from the AND gate is a digital "1" and disabled if the output signal from the AND gate is a digital "0."

11. The method of claim 10 further wherein determining whether the memory element is functional or defective comprises receiving a condition signal indicating whether the memory element is functional or defective.

12. The method of claim 11 wherein the condition signal is a digital "1" if the memory element is functional and a digital "0" if the memory element is defective, and wherein providing a latch comprises:

providing a direct-coupled NAND-gate RS flip-flop having two inputs, S and R, and an output Q';

coupling the R input to the output of a NAND gate having first and second inputs, the first input of the NAND gate being coupled to the condition signal and the second input of the NAND gate being coupled to the element-select signal; and coupling the Q' output to the second input of the AND gate.

13. The method of claim 9 further comprising the following steps if the memory element is defective:

providing a spare memory element;

storing the address of the defective memory element;

receiving the requested address of a memory element that the host requests access to;

comparing the address of the defective memory element to the requested address; and if the address of the defective memory element matches the requested address, enabling the spare memory element.

14. The method of claim 13 wherein comparing comprises providing a plurality of equivalence gates, each adapted to receive one bit of the address of the defective memory element and a corresponding bit of the requested address, and wherein the spare memory element is enabled when the output of all the equivalence gates is a digital "1."

15. A system of handling defective memory elements in a memory array, comprising:

a memory array including a plurality of memory elements;

an address decoder adapted to receive a requested memory address and to produce a plurality of element-select signals, each element-select signal being associated with one of the memory elements and indicating whether access to the associated memory element is requested by a host; and a logic circuit having first and second inputs and an output, the first input being coupled to the associated element-select signal, the second input being coupled to a condition signal representative of whether the associated memory element is functional or defective, and the output being coupled to the associated memory element, wherein the logic circuit passes the associated element-select signal to the associated memory element or blocks the associated element-select signal from reaching the associated memory element based on the condition signal.

16. The system of claim 15 wherein the logic circuit comprises:

a latch having a latch input coupled to the condition signal and a latch output; and a logic gate having a first logic input coupled to the latch output, a second logic input coupled to the associated element-select signal and a logic output coupled to the associated memory element.

* * * * *